(12) United States Patent
Krüger

(10) Patent No.: US 6,759,848 B2
(45) Date of Patent: Jul. 6, 2004

(54) MAGNETIC RESONANCE METHOD AND APPARATUS FOR SPATIALLY RESOLVED PRESENTATION OF CHANGE IN THE FUNCTIONAL ACTIVITIES OF A BRAIN

(75) Inventor: Gunnar Krüger, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/428,553

(22) Filed: May 2, 2003

(65) Prior Publication Data

US 2003/0214297 A1 Nov. 20, 2003

(30) Foreign Application Priority Data

May 17, 2002 (DE) .......................................... 102 22 626
Oct. 29, 2002 (DE) .......................................... 102 50 379

(51) Int. Cl.[7] .............................................. G01V 3/00
(52) U.S. Cl. ........................................ 324/318; 324/309
(58) Field of Search ................................ 324/318, 319, 324/309, 307, 300, 316; 600/410; 382/128

(56) References Cited

U.S. PATENT DOCUMENTS 6,073,041 A * 6/2000 Hu et al. .................... 600/410
6,076,004 A * 6/2000 Kanayama et al. .......... 600/410
6,298,258 B1 * 10/2001 Heid et al. ................... 600/410
6,490,472 B1 * 12/2002 Li et al. ...................... 600/410
6,528,997 B2 * 3/2003 Zhong et al. ................ 324/307

* cited by examiner

Primary Examiner—Brij B. Shrivastav
(74) Attorney, Agent, or Firm—Schiff Hardin LLP

(57) ABSTRACT

In a method and magnetic resonance tomography apparatus for spatially resolved presentation of a change of functional activities in the brain of a living subject by means of magnetic resonance, temporally successive magnetic resonance images of the brain of the subject stimulated with a stimulus are produced upon variation of at least one of the excitation angle and the echo time, a noise part for each pixel is calculated referenced to identical pixels of the temporally successive images, the noise part of each pixel is resolved into a first noise component independent of the excitation angle and a second noise component dependent on the excitation angle, the second noise component of the noise part of each pixel is resolved into a third noise component independent of the echo time and a fourth noise component dependent on the echo time, and the fourth noise component of the noise part of each pixel obtained in this way is employed for detecting neural activity changes in the brain of the living subject under observation.

14 Claims, 3 Drawing Sheets

FIG 2B  SIGNAL

IMAGE NUMBER curve of the third noise component echo time TE curve of the fourth noise component echo time TE FIG 6  curve of the square of the slope echo time —— square of the slope
·········· third component
— — — fourth component

MAGNETIC RESONANCE METHOD AND APPARATUS FOR SPATIALLY RESOLVED PRESENTATION OF CHANGE IN THE FUNCTIONAL ACTIVITIES OF A BRAIN

BACKGROUND OF THE INVENTION

1. Field of the Invention

The present invention is directed to a method and to a magnetic resonance tomography apparatus for spatially resolved presentation of a change in the functional activities of a brain of a living subject under observation by means of magnetic resonance.

2. Description of the Prior Art

It is known that brain activities in the cerebral cortex of human beings elicited by external stimulation can be detected with magnetic resonance tomography. Such an external stimulation can be a visual or an acoustic stimulus, for example.

An experiment typically implemented with magnetic resonance tomography is referred to as the fMRI-BOLD experiment. "fMRI" stands for functional magnetic resonance imaging and BOLD stands for "blood oxygenation level dependent". A goal of functional magnetic resonance tomography (imaging) is to exactly detect the activity changes in the brain of the living subject under observation that are attributed to a specific stimulation. Before the surgical removal of a brain tumor, for example, it is thus possible to demarcate functional centers of the brain from the tumor in order to avoid damage to functionally important regions of the brain of the patient.

The BOLD effect is based on the different magnetic properties of oxygenated and de-oxygenated hemoglobin in the blood. In contrast to the diamagnetic oxyhemoglobin, desoxyhemoglobin has two unpaired iron electrons and is therefore paramagnetic. An increase in the local concentration of desoxyhemoglobin as a result of a local brain activity (neural activity) therefore leads to an non-homogeneous local magnetic field. This accelerates the decay of the imaging cross-magnetization of nuclear spins excited by means of a magnetic resonance tomography apparatus. Given intensified brain activity, the increased oxygen need associated therewith is over-compensated by an increased delivery of diamagnetic oxyhemoglobin. Gradient echo sequences of the magnetic resonance tomography apparatus, which react especially sensitively to local field inhomogeneities, therefore exhibit a weak intensity boost in the magnetic resonance image given intensified brain activity.

A crucial problem in functional magnetic resonance tomography is thus to separate brain activities elicited by a specific stimulation from other brain activities.

For solving this problem, it is known to calculate a correlation coefficient between a stimulation function employed for stimulation and the obtained, temporal signal curve of a pixel (picture element) for each pixel of time-successive magnetic resonance images (frequently several hundred) of the brain of the living subject under observation. Mathematically formulated, a determination is made for each pixel as to whether there is a significant relationship between the time curve of the stimulation function and a brightness fluctuation of the pixel.

This means that the time curve of the stimulation function, referenced to the magnetic resonance images of the brain of the living subject under observation that are produced, must be known before the implementation of the correlating. Periodic functions therefore are usually employed as stimulation functions. A typical stimulation function is a periodic sequence of stimulations separated by pauses (for example, 20 sec. of finger movement, 30 sec. of rest, 20 sec. of finger movement, 30 sec. of rest, . . .).

A disadvantage of the above-described correlation is that an exact knowledge of the stimulation function is required so that cognitive processes being examined can be detected.

SUMMARY OF THE INVENTION

An object of the present invention is to provide a method and a magnetic resonance tomography apparatus that enable a detection of changes in the functional activities of a brain of a living subject under observation in a simple way and with high precision, even without knowledge of a time curve of the (usually external) stimulation.

This object is achieved according to the present invention, in a method for spatially resolved presentation of a change of functional activities in the brain of a living subject under observation by means of magnetic resonance tomography wherein temporally successive magnetic resonance images of the brain of the living subject stimulated by a stimulus (external or otherwise) are obtained upon variation of at least one of the excitation angle and the echo time from image to image, a noise part is calculated for each pixel referenced to identical pixels of the temporally successive images, the noise part of each pixel is resolved into a first noise component independent of the excitation angle and a second noise component dependent on the excitation angle, the second noise component of the noise part of each pixel is resolved into a third noise component independent of the echo time and a fourth noise component dependent on the echo time, and the fourth noise component of the noise part of each pixel is employed for detecting neural activity changes in the brain of the living subject under observation.

Even without knowledge of the time curve of the stimulation of the living subject and without implementing a cross-correlation, a t-test or some other statistical method operating by means of reference function, the inventive method makes it possible to detect neural activity changes in the brain of a living subject under observation.

Consequently, cognitive processes or activity changes in the brain of the living subject that can be attributed to statistical processes can be detected with the inventive method.

Since this detection inventively ensues for each pixel, the detected activity changes can be presented spatially resolved. Since the noise components that are independent of the excitation angle and the echo time do not contribute to the detection of the pixels representing activity changes that are sought, moreover, an especially high sensitivity of the activity changes in the brain of subject can be achieved.

The step of calculating a noise part referenced to identical pixels of the temporally successive images for each pixel preferably ensue by calculating the standard deviation of the signal curve for each pixel in the individual images that are produced.

The step of resolving the noise part of each pixel into the first noise component independent of the excitation angle and the second noise component dependent on the excitation angle preferably ensues by observing at least two images produced using different excursion angles.

The inventive method is based on the fact that the sum of the squares of the first noise component $\sigma_T$ and of the second noise component $\sigma_P$ yields the square of the total noise $\sigma$, $\sigma^2 = \sigma_T^2 + \sigma_P^2$.

In a preferred embodiment of the inventive method, the step of resolving the noise part of each pixel into the first noise component and the second noise component is performed by calculating the square of the noise part of each and every pixel for at least two different excursion angles, the values for the square of the noise part acquired in this way defining a straight line in a graph with the square of the noise part on the abscissa and the square of the signal intensity corresponding to the excursion angle on the ordinate, this straight line intersecting the abscissa given an excitation angle of zero degrees, and thus given a signal intensity of zero, and determining the value for the square of the noise part at the intersection of the straight line with the abscissa in order to obtain the value for the square of the first noise component independent of the excitation angle, and determining the slope of the straight line defined in this way and multiplying the slope by the square of the respective signal intensity to obtain the value for the square of the second noise component.

The inventive method is based on the fact that the second noise component $\sigma_P$ is characterized by the signal intensity, which can be modulated by the excitation angle, $$\sigma_P = \lambda \cdot s,$$

wherein $\lambda$ is a constant slope and s is the square of the signal intensity.

The determination of the value for the square of the noise part in the intersection of the straight line with the abscissa in order to obtain the value for the square of the first noise component independent of the excitation angle thereby need not be implemented graphically way but preferably ensues computationally.

The slope of the straight line defined in this way that is determined for each pixel can be employed as a physical criterion for the reduction of the signal-to-noise ratio that respective pixel in the magnetic resonance images with $T_2^*$ weighting, since a further factor that characterizes the respective pixels is thus acquired.

The step of resolving the second noise component of the noise part of each pixel into the third noise component independent of the echo time and the fourth noise component dependent on the echo time particularly ensues by observing at least two images produced using different echo times.

The third and fourth noise components can be determined especially easily by comparing the two images produced with different echo times.

The inventive method is based on the fact that the sum of the squares of the third noise component $\sigma_{NB}$ and of the fourth noise component $\sigma_B$ is equal to the square of the second noise component $\sigma_P$, $\sigma_P^2 = \sigma_{NB}^2 + \sigma_B^2$.

In a preferred embodiment, the curve of the third noise component $\sigma_{NB}$ can be described as $\sigma_{NB} \sim S_0 \cdot \exp(-TE \cdot R_2^*)$, wherein $R_2^*$ is a transversal-relaxation rate contained in an acquired magnetic resonance signal, TE is the echo time of the respective, produced magnetic resonance images and $S_0$ is a start value for an echo time equal to zero of a magnetic resonance signal weighted with an effective relaxation time $T_2^*$.

Correspondingly, the curve of the fourth noise component $\sigma_B$ according to this preferred embodiment can be described as $\sigma_B \sim S_0 \cdot TE \cdot R_2^* \cdot \exp(-TE \cdot R_2^*)$, wherein $R_2^*$ is a transversal-relaxation rate contained in an acquired magnetic resonance signal, TE is the echo time of the respective, produced magnetic resonance images and $S_0$ is a start value for an echo time equal to zero of a magnetic resonance signal weighted with an effective relaxation time $T_2^*$.

The step of resolving the second noise component of the noise part of each and every pixel into the third noise component and the fourth noise component then preferably proceeds by calculating the square of the noise part of each pixel for at least two different excitation angles for at least two different echo times, the values for the square of the noise part acquired in this way for each echo time respectively defining a straight line in a graph with the square of the noise part on the abscissa and the square of the signal intensity proportional to the excitation angle on the ordinate, determining the slope of the straight line defined in this way in order to obtain the square of the third noise component and in order to obtain the square of the fourth noise component, and deriving the third noise component $\sigma_{NB}$ and the fourth noise component $\sigma_B$ according to the equations $\sigma_{NB} \sim S_0 \cdot \exp((-TE \cdot R_2^*)$ and $\sigma_B \sim S_0 \cdot TE \cdot R_2^* \cdot \exp(-TE \cdot R_2^*)$, wherein $R_2^*$ is a transveral-relaxation rate contained in an acquired magnetic resonance signal, TE is the echo time of the respective magnetic resonance images and $S_0$ is a start value for an echo time equal to zero of a magnetic resonance signal weighted with an effective relaxation time $T_2^*$.

Again, the derivation of the third noise component and fourth noise component by adaptation of the third noise component and fourth noise component to the squares of the slope obtained for each echo time thereby need not ensue graphically but preferably is implemented computationally.

Neural activity changes in the brain of the subject are especially accessible to a further evaluation by a specialist when the step of employing the fourth noise component of the noise part of each pixel for detecting neural activity changes in the brain of the subject includes the step of a spatially resolved presentation of the fourth noise component.

The aforementioned object is also achieved by a magnetic resonance tomography apparatus having a device for spatially resolved presentation of functional activity changes of a brain of a living subject under observation by means of magnetic resonance according to the above-described method, having a control unit that controls the magnetic resonance tomography apparatus for producing temporally successive magnetic resonance images of the brain of the subject stimulated with a stimulus with variation of at least one of the excitation angle and of the echo time; as well as a processing device which calculates a noise part for each pixel referenced to identical pixels of the temporally successive images, in order to resolve the noise part of each pixel into a first noise component independent of the excursion angle and into a second noise component dependent on the excitation angle, and to resolve the second noise component of the noise part of each pixel into a third noise component independent of the echo time and a fourth noise component dependent on the echo time, and to detect neural activity changes in the brain of the subject using the fourth noise component of the noise part of each pixel obtained in this way.

The inventive method thus can be implemented by means of the inventive magnetic resonance tomography apparatus.

In order to facilitate an evaluation of the neural activity changes in the brain of the subject detected by means of the magnetic resonance tomography apparatus by a specialist in an especially appealing way, it is advantageous for the magnetic resonance tomography apparatus also to have a display device that visualizes the neural activity changes in the brain of the subject by means of spatially resolved presentation of the fourth noise component.

DESCRIPTION OF THE DRAWINGS

FIGS. 2A and 2B schematically illustrate a known method for calculating a signal time curve of a pixel over a series of magnetic resonance images.

FIG. 6 is a schematic illustration of the curve of the second noise component σP over the echo time.

DESCRIPTION OF THE PREFERRED EMBODIMENTS

Figure 1:
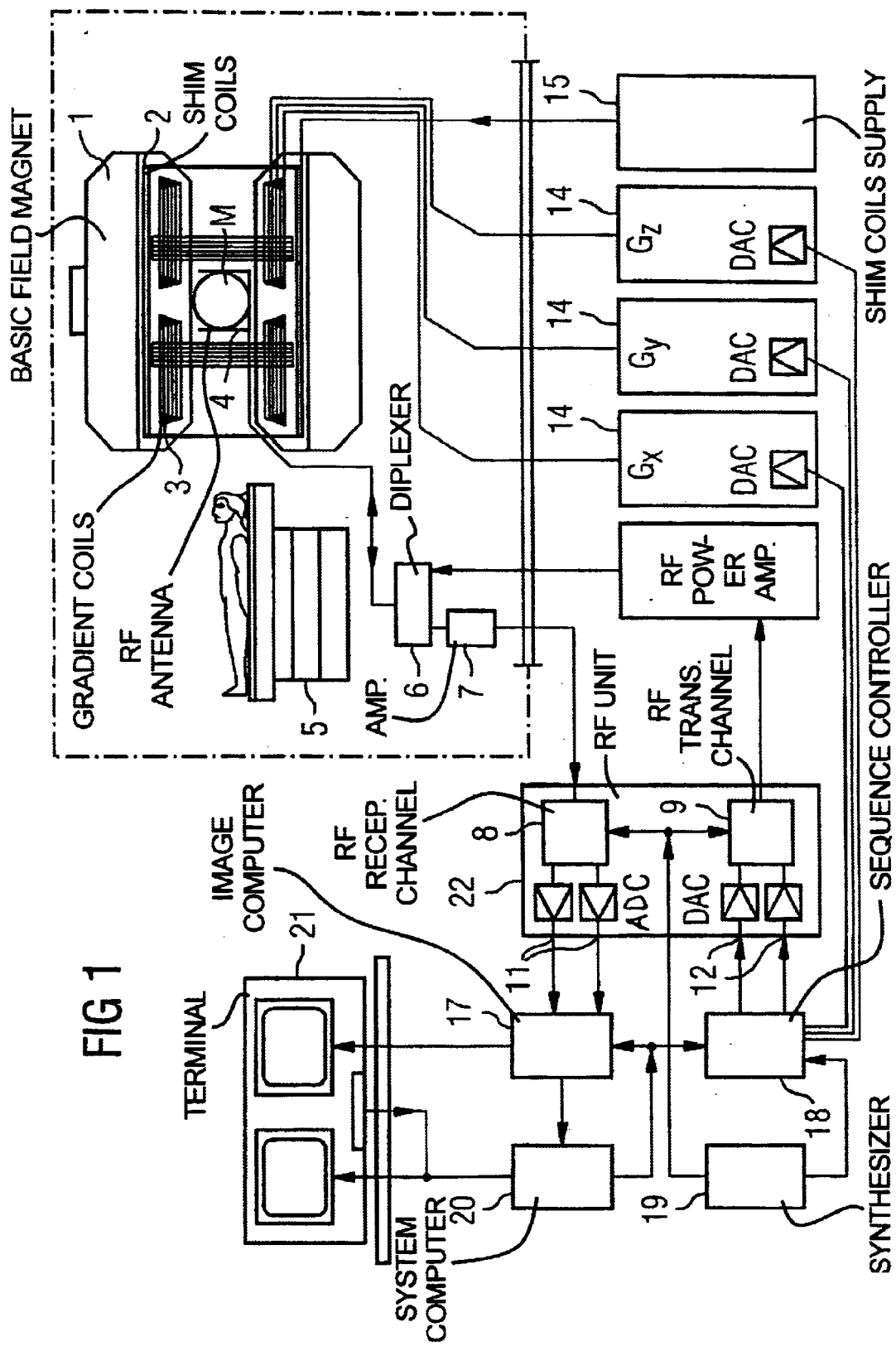
FIG. 1 is a schematic illustration of an inventive magnetic resonance tomography apparatus.

FIG. 1 is a schematic illustration of a magnetic resonance imaging (magnetic resonance tomography) apparatus for generating a magnetic resonance image of a subject according to the present invention. The structure of the magnetic resonance tomography apparatus corresponds to the structure of a conventional tomography apparatus with the differences described below. A basic field magnet 1 generates a temporally constant, strong magnetic field for the polarization or alignment of the nuclear spins in the examination region of a subject such as, for example, a part of a human body to be examined. The high homogeneity of the basic magnetic field required for the magnetic resonance measurement is defined in a measurement volume M, for example a spherical volume, into which the parts of the human body to be examined are introduced. Shim plates of ferromagnetic material are attached at suitable points for supporting the homogeneity requirements and, in particular, for eliminating time-invariable influences. Time-variable influences are eliminated with shim coils 2 that are driven by a shim power supply 15.

A cylindrical gradient coil system 3 that is composed of three windings (coils) is introduced into the basic field magnet 1. An amplifier 14 supplies each winding with power for generating linear gradient fields in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Linear gradient fields also can be generated in arbitrary spatial direction by combination of the Cartesian gradient fields. Each amplifier 14 has a digital-to-analog converter that is driven by a sequence controller 18 for generating gradient pulses at the correct times.

A radio-frequency antenna 4 is located within the gradient field system 3, this radio-frequency antenna 4 converting the radio-frequency pulses supplied by a radio-frequency power amplifier into a magnetic alternating field for the excitation of the nuclei and alignment of the nuclear spins of the examination subject, or the region of the subject to be examined. The radio-frequency antenna 4 is composed of one or more radio-frequency transmission coils and one or more radio-frequency reception coils, possibly composed of an arrangement of component coils (generally called "coil arrays" or "phased array coils"). The radio-frequency reception coils of the radio-frequency antenna 4 also convert the alternating field emanating from the precessing alternating field, i.e. the magnetic resonance echo signals (usually caused by a pulse sequence composed of one or more radio-frequency pulses and one or more gradient pulses), into a voltage that is supplied via an amplifier 7 to a radio-frequency reception channel 8 of a radio-frequency system 22. The radio-frequency system 22 also has a transmission channel 9 in which the radio-frequency pulses for the excitation of the magnetic resonance are generated. The respective radio-frequency pulses are digitally presented as a sequence of complex numbers in the sequence controller 18 on the basis of a pulses sequence prescribed by the system computer 20. As a real part and an imaginary part, this number sequence is supplied via a respective input 12 to a digital-to-analog converter in the radio-frequency system 22 and from the latter to a transmission channel 9. In the transmission channel 9, the pulse sequences are modulated onto a carrier signal having a base frequency corresponding to the resonant frequency of the nuclear spins in the measurement volume.

The switching from transmission mode to reception mode ensues via a transmission-reception diplexer. The RF transmission coil of the radio-frequency antenna 4 emits the radio-frequency pulses for exciting the nuclear spins into the measurement volume M and detects (receives) resulting echo signals via the RF reception coils. The correspondingly acquired magnetic resonance signals are phase-sensitively demodulated in the reception channel 8 of the radio-frequency system 22 and are converted into the real part and the imaginary part of the measured signal via respective analog-to-digital converters. An image computer 17 reconstructs an image from the measured data acquired in this way. On the basis of a prescription with a control program, the sequence controller 18 controls the generation of the desired pulse sequence and the corresponding sampling of k-space. In particular, the sequence controller 18 controls the switching of the gradients at the proper time, the emission of the radio-frequency pulses with defined phase and amplitude as well as the reception of the magnetic resonance signals. The time base (clock) for the radio-frequency system 22 and the sequence controller 18 is made available by a synthesizer 19. The selection of corresponding control programs for generating a magnetic resonance image as well as the presentation of the generated magnetic resonance image ensues via a terminal 21 that has a keyboard as well as one or more picture screens. The terminal 21 also serves for evaluating the magnetic resonance images.

In the inventive magnetic resonance tomography apparatus for spatially resolved presentation of changes in the functional activities of a brain of a living subject under observation by means of magnetic resonance that is shown in FIG. 1, a control unit and a processing device are integrated in the above-described system computer 20 of the magnetic resonance apparatus.

Such an integration of the control unit and of the processing device into the system computer 20 can ensue on the hardware level as well as on the software level.

In FIG. 1, the control unit and the processing device are integrated into the system computer 20 on the software level.

Alternatively, the control unit and/or the processing device can be implemented as separate hardware components.

The control unit integrated into the system computer 20 is fashioned to control the magnetic resonance tomography apparatus for producing temporally successive magnetic resonance images 30 of the brain of the subject upon with variation of the excitation angle and the echo time TE.

The excitation angle is the angle by which the nuclear spins in the brain of the subject, that are aligned by the basic magnetic field generated by the basic field magnet 1, are deflected relative to their aligned orientation by a high-frequency electromagnetic field that is emitted as one or more pulses by the magnetic resonance tomography apparatus (but of which only the magnetic component is relevant). The magnitude of the excitation angle thus is also a criterion for the amplitude of the excitation pulse, and thus the signal intensity. It should be noted, however, that there is no linear relationship between the signal intensity and the excitation angle even though the signal intensity is modulated by the excitation angle.

The echo time is the time interval between the excitation pulse and the point in time of the signal reception.

For example, the living subject can be stimulated by a stimulation function in an acoustic way.

An external stimulation of the subject, however, can ensue, for example, by means of a cognitive process (for example, recognizing a person pictured on an image that is shown) or dependent on a statistical event.

According to this embodiment, further, the excitation angle employed for the production of the magnetic resonance images is modified in steps between, for example, 18°, 42° and 90° as a result of a control command of the control unit in the system computer 20 to the magnetic resonance tomography apparatus, so that a respective plurality of temporally successive magnetic resonance images 30 with different echo time are produced for each excursion angle. In this example, the values for the echo time lie between 7 ms and 90 ms.

According to an alternative embodiment (which is not described in further detail), the echo time is kept constant in the temporally successive images and the excitation angle is varied. Of course, the excitation angle and the echo time can be simultaneously varied between temporally successive images as an alternative.

Figure 2A:
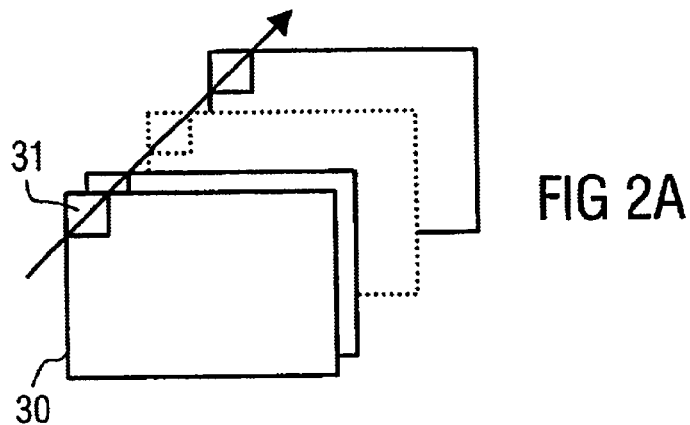

As can be seen from FIG. 2A, number of images 30 of the brain of the subject stimulated by means of the external stimulation is first produced with the inventive magnetic resonance tomography apparatus upon variation of other storage of the excitation angle and the echo time. These are in turn composed of a number of pixels 31 (picture elements).

Since the magnetic resonance images 30 were acquired in chronological succession by the magnetic resonance tomography apparatus, they necessarily contain information about the time curve of the received signal, FIG. 2B schematically shows a corresponding signal curve of a pixel 31 over the successive images (and thus over time).

The processing device of the inventive magnetic resonance tomography apparatus that is likewise integrated in the system computer 20 is fashioned in order to calculate a noise part $\sigma$ for each and every pixel 31 that is referenced to identical pixels 31 of the temporally successive images 30 with identical excitation angle and echo time.

According to this embodiment, this ensues for each pixel by calculating the standard deviation of the signal curve in the individual images 30 produced for each pixel, as symbolized by the arrow shown in FIG. 2A.

After the calculation of the noise part $\sigma$ for each pixel 31 by the processing device that is referenced to identical pixels of the temporally successive images 30, the processing device implements a resolution of the noise part $\sigma$ of each pixel into a first noise component $\sigma_T$ independent of the excitation angle and a second noise component up dependent on the excitation angle.

The first noise component $\sigma_T$ independent of the excitation angle is also referred to as "thermal noise".

A second noise component $\sigma_P$ dependent on the excitation angle is attributed to fluctuations of the basic brain metabolism, the blood flow, of the blood volume and to oscillations of the vascular system as result of respiration and heartbeat, and is therefore also referred to as "physiological noise".

According to the embodiment described here, the resolution of the noise part $\sigma$ of each pixel into the first and second noise component $\sigma_T$, $\sigma_P$ in the processing device ensues by observing at least images 30 produced with different excitation angles.

The processing device first calculates the square of the noise part $\sigma$ of each pixel for at least the two different excursion angles.

Figure 3:
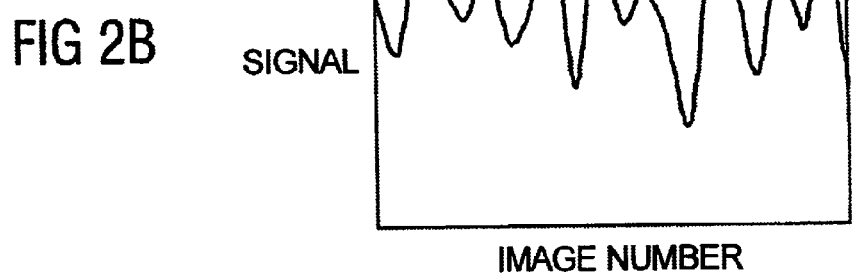
FIG. 3 is a schematic illustration of the curve of the square of the noise part of a respective pixel over the excitation angle.
Figure 3:
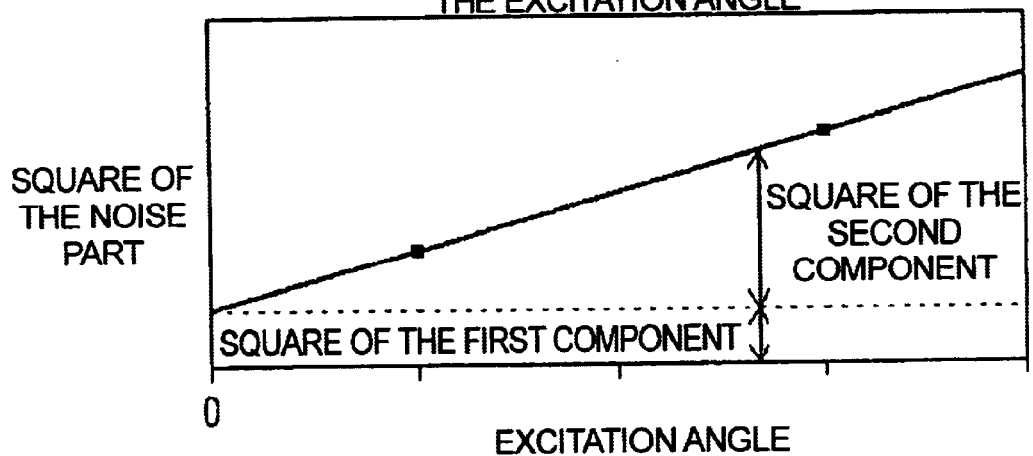

As shown in FIG. 3, the at least two values for the square of the noise part $\sigma$ acquired in this way define a straight line in a diagram with the square of the noise part $\sigma$ on the abscissa and the square of the signal intensity dependent on the excursion angle on the ordinate, this straight line intersecting the abscissa given an excursion angle of zero degrees.

Subsequently, the processing device determines the value for the square of the noise part $\sigma$ at the intersection of the straight line with the abscissa in order to thus obtain the value for the square of the first noise component $\sigma_T$ independent of the signal intensity and, thus, of the excursion angle.

Further, the processing device determines the slope $\lambda$ of the straight line.

Since according to this preferred exemplary embodiment the square of noise part $\sigma$ of each and every pixel 31 is equal to the sum of the squares of the first noise component $\sigma_T$ and the second noise component cap, the processing device can now calculate the values of the squares of the second noise component $\sigma_P$ that is dependent on the excitation angle, for the at least two excitation angles, by subtracting the identified values for the square of the first noise component $\sigma_T$ from the respective value for the square of the noise part $\sigma$.

It should be noted that the second noise component $\sigma_P$ preferably is calculated with the equation $\sigma_P = \lambda \cdot s$, since the slope $\lambda$ of the straight line is contained in the second noise component $\sigma$.

This is illustrated in FIG. 3, wherein the first and the second noise components are referred to in simplified fashion as first and second component.

By subsequently taking the square root, which can likewise ensue with the processing device, the sought values for the first noise component $\sigma_T$ independent of the excitation angle and the second noise component $\sigma_P$ dependent on the excitation angle are obtained, so that the inventively desired resolution of the noise part $\sigma$ is accomplished.

According to the present invention, the processing device also resolves the second noise component $\sigma_P$ of the noise part $\sigma$ of each pixel 31 acquired in this way into a third noise component $\sigma_{NB}$ independent of the echo time and a fourth noise component $\sigma_B$ dependent on the echo time TE.

The third noise component $\sigma_{NB}$ is caused, among other things, by brain pulsation due, for example, to heartbeat and respiration of the living subject under observation.

Figure 4:
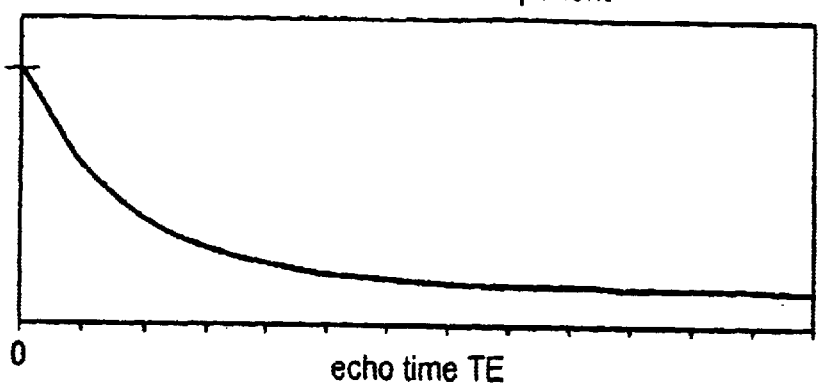
FIG. 4 is a schematic illustration of the curve of the third noise component of each pixel over the echo time.

According to this preferred embodiment, the third noise component $\sigma_{NB}$ exhibits the curve that is schematically shown in FIG. 4 and mathematically described as $\sigma_{NB} \sim S_0 \cdot \exp(-TE \cdot R_2^*)$, or with the proportionality constant $c_1$, $\sigma_{NB} = C_1 \cdot S_0 \cdot \exp(-TE \cdot R_2^*)$.

The fourth noise component $\sigma_B$ reflects signal fluctuations that are caused by a fluctuation of an effective relaxation time $T_2^*$. The effective relaxation time $T_2^*$ is always shorter than a true substance-specific cross-relaxation time $T_2$ and is produced by spatial inhomogeneities of the static basic field generated by the basic field magnet 1.

Figure 5:
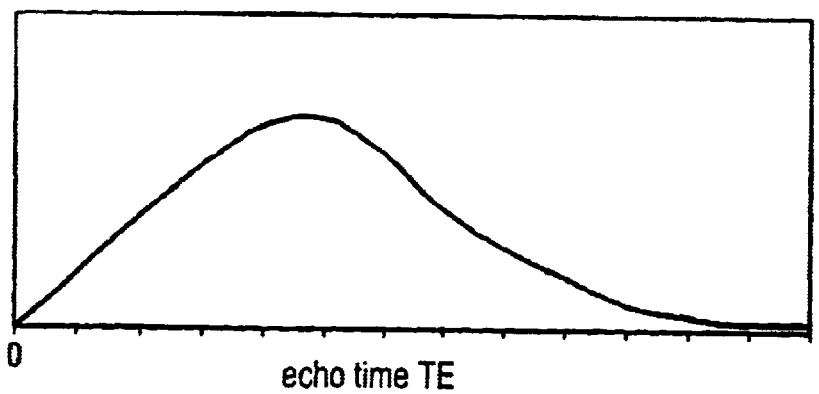
FIG. 5 is a schematic illustration of the curve of the fourth noise component of each pixel over the echo time.
Figure 5:
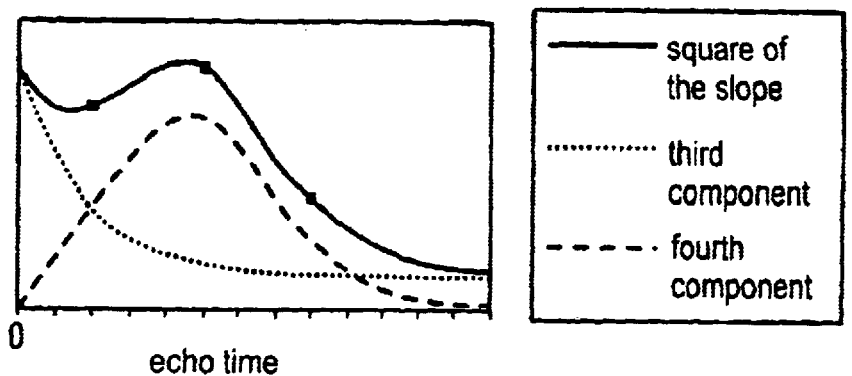

In this example, the fourth noise component $\sigma_B$ exhibits the curve that is schematically shown in FIG. 5 and mathematically described as $\sigma_B \sim S_0 \cdot TE \cdot R_2^* \cdot \exp(-TE \cdot R_2^*)$, or with the proportionality constant, $\sigma_B = C_2 \cdot S_0 \cdot TE \cdot R_2^* \cdot \exp(-TE \cdot R_2^*)$.

In the mathematical expressions for the third noise component $\sigma_{NB}$ and the fourth noise component $\sigma_B$, $R_2^*$ stands for a transversal-relaxation rate contained in an acquired magnetic resonance signal (and, thus, in an acquired magnetic resonance image), TE stands for the echo time of the respectively produced magnetic resonance images 30, and $S_0$ stands for an initial value for an echo time equal to zero of a magnetic resonance signal weighted with the effective relaxation time $T_2^*$. The transversal-relaxation rate $R_2^*$ is the inverse of the effective relaxation time $$T_2^*, T_2^* = \frac{1}{R_2^*}.$$

In the preferred embodiment, the square of the second noise component $\sigma_P$ of the noise part $\sigma$ of each pixel 31 is equal to the sum of the squares of the third noise component $\sigma_{NB}$ and the fourth noise component $\sigma_B$.

The resolution of the second noise component $\sigma_P$ of the noise part $\sigma$ of each pixel into the third noise component $\sigma_{NB}$ independent of the echo time TE and the fourth noise component $\sigma_B$ dependent on the echo time TE ensues in the processing device by observing at least two images 30 produced with echo times TE.

As described above, the square of the noise part $\sigma$ is first calculated in the processing device for at least two different echo times TE. the values for the slope $\lambda^2$ acquired in this way for the at least two echo times TE will respectively define a straight line in a graph with the square of the slop on the abscissa and the square of the echo time on the ordinate. This has already analogously been set forth above for the determination of $\sigma_P = \lambda^* S$.

A determination of the value in the intersection of the straight line with the abscissa $(c_1^2)$ supplies the square of the third noise component $\sigma_{NB}^2 = c_1^2 \cdot S^2$ according to $\lambda^2 = c_1^2 + c_2^2 \cdot R_2^{*2} \cdot TE^2$.

Simultaneously, the processing device determines the slope $C_2^2 \cdot R_2^{*2} \cdot TE^2$ of the straight-line defined in this manner. The identified slope thus supplies the square of the fourth noise component $\sigma_B^2 = C_2^2 \cdot R_2^{*2} \cdot TE^2 \cdot S^2$.

As schematically shown in FIG. 6, the slopes $\lambda$ determined in this way device a function dependent on the echo time TE. The slopes $\lambda$ can be interpreted as a physical criterion for the reduction of the signal-to-noise ratio of the respective pixel 31 of the magnetic resonance images 30.

Since the fundamental curve of the third noise component $\sigma_{NB}$ and of the fourth noise component $\sigma_B$ according to this preferred embodiment is known is explained above (see FIGS. 4 and 5), the processing device can derive the third noise component $\sigma_{NB}$ and the fourth noise component $\sigma_B$ by adaptation of the third noise component $\sigma_{NB}$ and the fourth noise component $\sigma_B$ to the squares of the slopes $\lambda$ obtained for each echo time TE.

The derivation of the third noise component $\sigma_{NB}$ and the fourth noise component $\sigma_B$ on the basis of the squares of the slopes $\lambda$ obtained for each echo time TE need not ensue in a geometrical (graphical) way but preferably is implemented analytically (computationally) by the processing device of the inventive magnetic resonance tomography apparatus.

According to the present invention, the processing device of the inventive magnetic resonance tomography apparatus also is fashioned for detecting the neural activity changes in the brain of the subject that can be attributed to an external stimulus using the fourth noise component $\sigma_B$ of the noise part $\sigma$ of each and every pixel 31 obtained in this way.

Without knowledge of the time curve the stimulation of the subject and without requiring an implementation of, for instance, a cross-correlation, the inventive magnetic resonance tomography apparatus and the inventive method make it possible to detect neural activity changes in the brain of the subject that are attributable to the stimulation.

Consequently, activity changes in the brain of the subject that are dependent on cognitive processes or on processes dependent on a statistical event (i.e., arising from a non-external stimulation) also can be detected with the inventive method.

Since, moreover, the noise components that are independent of the excitation angle and the echo time do not contribute to the detection of the sought pixels by the inventive magnetic resonance tomography apparatus according to the inventive method, an especially high sensitivity of the activity changes in the brain of the subject can be achieved.

In order to make the neural activity changes in the brain of the living subject under observation that are attributable to a stimulation especially accessible for evaluation by a specialist, the image computer 17 of the magnetic resonance tomography apparatus shown in FIG. 1 and described above also has a display device according to this preferred embodiment.

The display device is fashioned to visualize the neural activity changes in the brain of the subject by means of a spatially resolved presentation of the fourth noise component $\sigma_B$.

The neural activity changes in the brain of the subject detected by employing the fourth noise component $\sigma_B$ of the noise part $\sigma$ of each and every pixel can thus be evaluated especially easily and in a user-friendly way.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for spatially resolved presentation of a change of functional activities in the brain of a living subject under observation by magnetic resonance, comprises the steps of:

producing temporally successive magnetic resonance images, each having an excitation angle and an echo time associated therewith, of a living subject stimulated with a stimulus with variation of at least one of the excitation angle and the echo time from image-to-image, each image being composed of pixels;

calculating a noise part for each pixel an image referenced to identical pixels of the temporally successive images;

resolving the noise part of each pixel into a first noise component independent of the excitation angle and a second noise component dependent on the excitation angle;

resolving the second noise component of the noise part of each pixel into a third noise component independent of the echo time and a fourth noise component dependent on the echo time; and employing the fourth noise component of the noise part of each pixel for detecting neural activity changes in the brain of the living subject.

2. A method as claimed in claim 1 wherein each of said pixels exhibits a time curve over said plurality or images and wherein step (b) comprises a calculating the standard deviation of the time curve for each pixel.

3. A method as claimed in claim 1 wherein step (a) comprising varying said excitation angle and wherein step (c) comprises observing at least two of said images.

4. Method according to claim 3 wherein the square of the noise part of each pixel is equal to the sum of the square of the first noise component and the square of the second noise component.

5. A method as claimed in claim 4 wherein each pixel has a signal intensity dependent on said excitation angle and wherein step (c) comprises:

calculating the respective squares of the noise part of each and every pixel for at least two different excitation angles, the respective squares of the noise part defining a straight line in a graph with the square of the noise part on the abscissa and the square of the signal intensity of the excitation angle on the ordinate, the straight line intersecting the abscissa given an excitation angle of zero degrees and given a signal intensity of zero;

determining the value for the square of the noise part at the intersection of the straight line with the abscissa in order to obtain said square of the first noise component independent of the excitation angle; and determining the slope of said straight line defined and multiplying said slope by the square of the signal intensity to obtain said square of the second noise component.

6. A method as claimed in claim 5 comprising, for each pixel, employing the slope as a physical criterion for reducing the signal-to-noise ratio of that pixel.

7. A method as claimed in claim 1 wherein step (a) comprises varying said echo time and wherein step (d) comprises observing at least two of said images.

8. A method as claimed in claim 7 wherein the square of the second noise component $\sigma_P$ of the noise part is equal to the sum of the square of the third noise component $\sigma_{NB}$ and the square of the fourth noise component.

9. A method as claimed in claim 8 wherein the third noise component $\sigma_{NB}$ has a curve $\sigma_{NB} \sim S_0 \cdot \exp(-TE \cdot R_2^*)$, wherein $R_2^*$ is a transversal-relaxation rate contained in an acquired magnetic resonance signal, TE is the echo time of the respective magnetic resonance image and $S_0$ is a start value for an echo time equal to zero of a magnetic resonance signal weighted with an effective relaxation time $T_2^*$.

10. A method as claimed in claim 8 wherein the fourth noise component $\sigma_B$ has a curve $\sigma_B \sim S_0 \cdot TE \cdot R_2^* \cdot \exp(-TE \cdot R_2^*)$, wherein $R_2^*$ is a transversal-relaxation rate contained in an acquired magnetic resonance signal, TE is the echo time of the respective magnetic resonance image and $S_0$ is a start value for an echo time equal to zero of a magnetic resonance signal weighted with an effective relaxation time $T_2^*$.

11. A method as claimed in claim 8 wherein step (a) comprises varying both of said excitation angle and said echo time and wherein each pixel has a signal intensity dependent on the excitation angle and wherein step (d) comprises:

calculating respective squares of the noise part of each and every pixel for at least two different excitation angles for at least two different echo times, the respective squares of the noise part defining a straight line in a graph with the square of the noise part on the abscissa and the square of the signal intensity on the ordinate;

determining the slope of the straight line to obtain the square of the third noise component ($\sigma_{NB}^2$) and to obtain the square of the fourth noise component ($\sigma_B^2$);

deriving the third noise component $\sigma_{NB}$ and fourth noise component $\sigma_B$ defined according to $\sigma_{NB} \sim S_0 \cdot \exp(-TE \cdot R_2^*)$ and $\sigma_B \sim S_0 \cdot TE \cdot R_2^* \cdot \exp(-TE \cdot R_2^*)$, wherein $R_2^*$ is a transversal-relaxation rate contained in an acquired magnetic resonance signal, TE is the echo time of the respective magnetic resonance image and $S_0$ is a start value for an echo time equal to zero of a magnetic resonance signal weighted with an effective relaxation time $T_2^*$.

12. A method as claimed in claim 1 wherein step (e) comprises making a spatially resolved presentation of the fourth noise component ($\sigma_B$).

13. A magnetic resonance tomography apparatus comprising:

a magnetic resonance scanner and adapted to receive a living subject therein;

a control unit that is for operating said magnetic resonance tomography scanner to obtain temporally successive magnetic resonance images, each having an excitation angle and an echo time associated therewith, of the brain of the subject stimulated with a stimulus upon variation of at least one of the excitation angle and the echo time from image-to-image of said images composed of pixels;

a processing device, supplied with said image which calculates a noise part for each pixel referenced to identical pixels of the temporally successive images to resolve the noise part of each pixel into a first noise component independent of the excitation angle and a second noise component dependent on the excitation angle, resolves the second noise component of the noise part of each pixel into a third noise component independent of the echo time and a fourth noise component dependent on the echo time (TE), and to detect neural activity changes in the brain of the subject using the fourth noise component.

14. An apparatus as claimed in claim 13 comprising a display device connected to said processing device for visualizing the neural activity changes in the brain of the subject by a spatially resolved presentation of the fourth noise component.

* * * * *